United States Patent
Kikuta et al.

(10) Patent No.: US 10,553,455 B2
(45) Date of Patent: Feb. 4, 2020

(54) METHOD FOR ALIGNING CHIP COMPONENTS RELATIVE TO SUBSTRATE BY USING LIQUID

(71) Applicants: TOKYO ELECTRON LIMITED, Tokyo (JP); TOHOKU UNIVERSITY, Sendai-shi, Miyagi (JP)

(72) Inventors: Shinya Kikuta, Nirasaki (JP); Satohiko Hoshino, Nirasaki (JP); Takafumi Fukushima, Sendai (JP); Mitsumasa Koyanagi, Sendai (JP); Kangwook Lee, Sendai (JP)

(73) Assignees: TOKYO ELECTRON LIMITED, Tokyo (JP); TOHOKU UNIVERSITY, Sendai-Shi, Miyagi (JP)

( * ) Notice: Subject to any disclaimer, the term of this patent is extended or adjusted under 35 U.S.C. 154(b) by 0 days.

(21) Appl. No.: 16/085,205

(22) PCT Filed: Mar. 3, 2017

(86) PCT No.: PCT/JP2017/008482
§ 371 (c)(1),
(2) Date: Sep. 14, 2018

(87) PCT Pub. No.: WO2017/159401
PCT Pub. Date: Sep. 21, 2017

(65) Prior Publication Data
US 2019/0096697 A1 Mar. 28, 2019

(30) Foreign Application Priority Data
Mar. 17, 2016 (JP) .................. 2016-053712

(51) Int. Cl.
*H01L 21/52* (2006.01)
*H01L 21/68* (2006.01)

(52) U.S. Cl.
CPC .............. *H01L 21/52* (2013.01); *H01L 21/68* (2013.01)

(58) Field of Classification Search
None
See application file for complete search history.

(56) References Cited

U.S. PATENT DOCUMENTS

| | | | |
|---|---|---|---|
| 6,940,182 B2 * | 9/2005 | Hilton | H01L 21/563 257/787 |
| 8,349,652 B2 * | 1/2013 | Koyanagi | H01L 21/6835 438/107 |

(Continued)

FOREIGN PATENT DOCUMENTS

JP 5007127 B2 6/2012

*Primary Examiner* — Alexander G Ghyka
(74) *Attorney, Agent, or Firm* — Nath, Goldberg & Meyer; Jerald L. Meyer (57) ABSTRACT

A liquid is supplied to a substrate and a chip component is arranged on the liquid. The substrate includes a first surface in which a rectangular mounting region is formed. The chip component includes a second surface having a rectangular shape which substantially coincides with the shape of the mounting region, and has an area substantially equal to that of the mounting region. The mounting region includes first and second regions. Wettability of the first region with respect to the liquid is higher than that of the second region with respect to the liquid. The first region is provided symmetrically with respect to a first central line passing through the middle of a pair of long sides and a second central line passing through the middle of a pair of short sides in the mounting region, and includes rectangular partial regions. The liquid is supplied to the first region.

12 Claims, 11 Drawing Sheets

(56) References Cited

U.S. PATENT DOCUMENTS

| | | | |
|---|---|---|---|
| 2003/0168497 A1* | 9/2003 | Radeck | H01L 24/26 228/256 |
| 2009/0294978 A1* | 12/2009 | Ota | H01L 21/563 257/773 |
| 2010/0203676 A1* | 8/2010 | Theuss | H01L 21/561 438/109 |
| 2013/0045569 A1* | 2/2013 | Koyanagi | H01L 21/568 438/107 |
| 2017/0186733 A1* | 6/2017 | Dubey | H01L 24/05 |

* cited by examiner

FIG. 12 ofcomponent. The second surface has a rectangular shape which substantially coincides with the shape of the mounting region and has an area substantially equal to an area of the

METHOD FOR ALIGNING CHIP COMPONENTS RELATIVE TO SUBSTRATE BY USING LIQUID

This is a National Phase Application filed under 35 U.S.C. 371 as a national stage of PCT/JP2017/008482, filed Mar. 3, 2017, and claims priority from Japanese Patent Application No. 2016-053712, filed Mar. 17, 2016, the content of each of which is hereby incorporated by reference in its entirety.

TECHNICAL FIELD

The present disclosure relates to a method for aligning a chip component relative to a substrate by using a liquid.

BACKGROUND

Alignment of a chip component with respect to a mounting region of a substrate needs to be carried out with high accuracy and with ease. In general, in such an alignment, a chip component is held by a chip handler and mounted on a mounting region. As such, the accuracy of the alignment of the chip component depends on a relative positional accuracy of the chip component with respect to the chip handler and a transfer accuracy of the chip component held by the chip handler.

As a method for more accurately and easily performing the alignment of a chip component with respect to a mounting region, the following Patent Document 1 discloses a technique in which a liquid is supplied onto a mounting region, a chip component is arranged on the liquid, and the chip component is aligned with respect to the mounting region by virtue of a capillary force. The mounting region used in this method has high wettability with respect to a liquid. A region around the mounting region in a substrate has low wettability with respect to the liquid.

PRIOR ART DOCUMENTS

Patent Documents

Patent Document 1: Japanese Patent No. 5007127

Incidentally, the chip component and the mounting region usually have a rectangular planar shape extending to have a long length in one direction. When the chip component is aligned with respect to the mounting region having such a shape using a liquid, a positional deviation of the chip component with respect to the mounting region may occur.

Accordingly, in a method for aligning a chip component relative to a substrate by using a liquid, it is necessary to improve the accuracy of alignment.

SUMMARY

According to a first embodiment, there is provided a method for aligning a chip component relative to a substrate by using a liquid. The method includes: supplying a liquid remaining in a liquid state under a temperature environment lower than 100 degrees C. to the substrate; and arranging the chip component on the liquid. The substrate includes a first surface in which a mounting region having a rectangular shape extending to have a long length in one direction is formed. The chip component includes a second surface facing the mounting region in the arranging the chip component. The second surface has a rectangular shape which substantially coincides with the shape of the mounting region and has an area substantially equal to an area of the mounting region. The mounting region includes a first region and a second region other than the first region in the mounting region. A wettability of the first region with respect to the liquid is higher than a wettability of the second region with respect to the liquid. The first region is provided symmetrically with respect to a first central line orthogonal to a long side of the mounting region and provided symmetrically with respect to a second central line orthogonal to a short side of the mounting region, the first region including a plurality of partial regions each having a rectangular shape. The supplying a liquid includes supplying the liquid to the first region.

The liquid is applied to the mounting region configured as a region having high wettability throughout the entire region thereof (hereinafter referred to as a "lyophilic region"). When the chip component is arranged on the liquid in a state in which a positional deviation occurs between the mounting region and the chip component, the liquid seeps out from sides of the chip component. The seeping liquid generates a resistance force against a driving force (capillary force) to cause the chip component to move above the mounting region. In the case where both the mounting region and the second surface of the chip component are formed in a rectangular shape extending to have a long length in one direction, the amount of the liquid seeping from the sides of the chip component increases in a portion along the long side of the mounting region. Therefore, the resistance force in the direction orthogonal to the long side of the second surface of the chip component may increase and may become larger than the driving force in the direction orthogonal to the long side of the second surface of the chip component. As a result, the positional deviation between the mounting region and the chip component may not be eliminated.

The substrate used in the method according to one embodiment has a plurality of partial regions as lyophilic regions in the mounting region. Each of the plurality of partial regions has a rectangular shape. Therefore, a difference between the sum of the lengths of all the sides of the plurality of partial regions extending in the direction parallel to the long side of the mounting region and the sum of the lengths of all the sides of the plurality of partial regions extending in the direction parallel to the short side of the mounting region is smaller than a difference between the sum of the lengths of the long sides of the mounting region and the sum of the lengths of the short sides of the mounting region. Thus, the amount of liquid seeping from the sides of the chip component in the portion along the long side of the mounting region is reduced, so that the resistance force is in the direction orthogonal to the long side of the second surface of the chip component. Furthermore, a difference between the driving force in the direction orthogonal to the long side of the second surface of the chip component and the driving force in the direction orthogonal to the short side of the second surface of the chip component is reduced. Moreover, since the first region is provided symmetrically with respect to both the first central line and the second central line, the driving force for the chip component is exerted symmetrically with respect to the first central line and is exhibited symmetrically with respect to the second central line. In addition, the liquid is divided into a plurality of liquid masses by being supplied to the plurality of partial regions. Since the chip component is held by the plurality of liquid masses, the tilting of the chip component at the time of mounting is reduced. For that reason, according to this method, the accuracy of alignment of the chip component with respect to the mounting region is improved.

According to a second embodiment, there is provided a method for aligning a chip component relative to a substrate by using a liquid. The method includes: supplying a liquid remaining in a liquid state under a temperature environment lower than 100 degrees C. to the chip component; and arranging the substrate on the liquid. The substrate includes a first surface in which a mounting region having a rectangular shape extending to have a long length in one direction is formed. The chip component includes a second surface facing the mounting region in the arranging the substrate. The second surface includes a rectangular shape which substantially coincides with the shape of the mounting region and has an area substantially equal to an area of the mounting region. The second surface includes a first region and a second region other than the first region in the mounting region. A wettability of the first region with respect to the liquid is higher than a wettability of the second region with respect to the liquid. The first region is provided symmetrically with respect to a first central line orthogonal to a long side of the second surface and provided symmetrically with respect to a second central line orthogonal to a short side of the second surface, the first region including a plurality of partial regions each having a rectangular shape. The supplying a liquid includes supplying the liquid to the first region.

In the second embodiment, the liquid is supplied to the first region constituting a lyophilic region in the chip component. Even in the second embodiment, as in the first embodiment, the accuracy of alignment of the chip component with respect to the mounting region is improved.

In one embodiment, the shape of each of the plurality of partial regions may be a square shape. In this embodiment, a difference between the sum of the lengths of a pair of mutually parallel sides of the plurality of partial regions and the sum of the lengths of the other pair of mutually parallel sides of the plurality of partial regions is further reduced. Therefore, the accuracy of alignment of the chip component with respect to the mounting region is further improved.

In one embodiment, the first region may further include a connection region through which the plurality of partial regions is connected to each other. In this embodiment, even if the liquid is insufficient in some of the plurality of partial regions, the liquid is supplemented from other partial regions to some of the plurality of partial regions via the respective connection region.

In one embodiment, the first region may be formed of a silicon oxide, and the liquid may include a dilute hydrofluoric acid. According to this embodiment, the chip component and the substrate are bonded to each other by the silicon oxide dissolved by the dilute hydrofluoric acid after evaporation of the liquid.

In one embodiment, the liquid may include water and/or ethylene glycol.

As described above, in the method for aligning a chip component relative to a substrate by using a liquid, it is possible to improve the accuracy of alignment.

DETAILED DESCRIPTION

Hereinafter, various embodiments will be described in detail with reference to the drawings. In the drawings, the same or corresponding parts are designated by like reference numerals.

Figure 1:
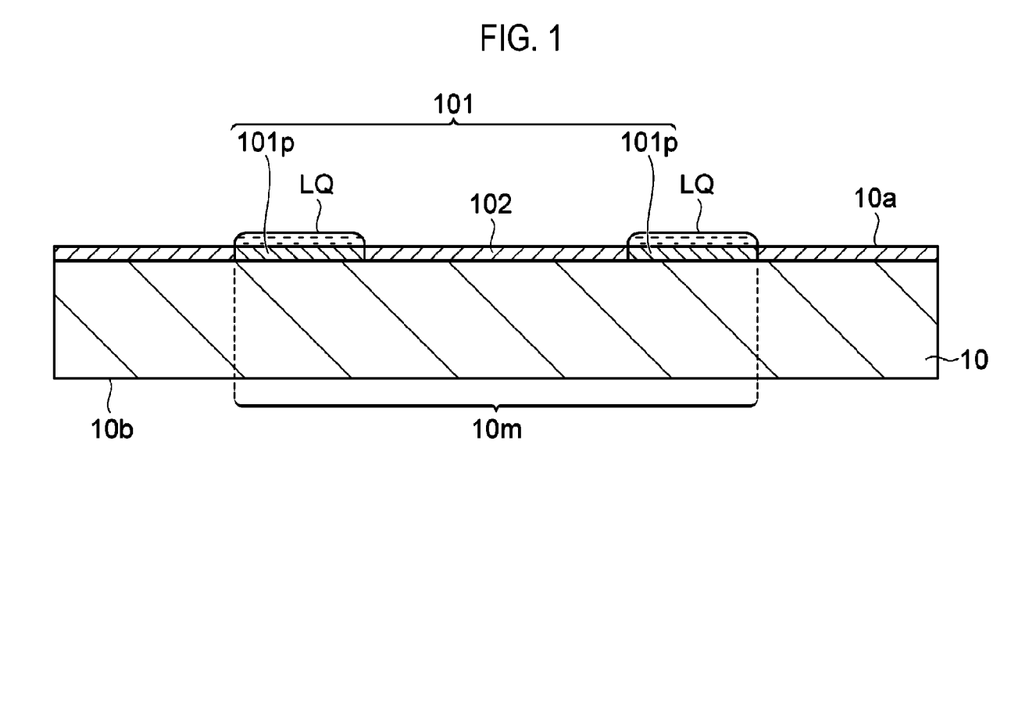
FIG. 1 is a view showing a first step of a method for aligning a chip component relative to a substrate by using a liquid, in accordance with one embodiment.

FIG. 1 is a view showing a first step of a method for aligning a chip component relative to a substrate by using a liquid, in accordance with one embodiment. In the first step of the method according to one embodiment, as shown in FIG. 1, a liquid LQ is supplied onto a first region 101 of a substrate 10.

The liquid LQ remains in a liquid state under a temperature environment lower than 100 degrees C. In one embodiment, the liquid LQ remains in a liquid state under a temperature environment of 70 degrees C. or less. The liquid LQ remaining in a liquid state in a temperature environment of 70 degrees C. or less is a liquid suitable for stably executing the method MT from the viewpoint of evaporation rate (vapor pressure). Water has a vapor pressure of about 31 kPa at 70 degrees C. and about 101 kPa at 100 degrees C. As such, water may be used as the liquid LQ remaining in a liquid state under a temperature environment of 70 degrees C. or less. An arbitrary solvent having a high boiling point may be used as the liquid LQ. The liquid LQ may be, but is not limited to, for example, any one of ethylene glycol, a dilute hydrofluoric acid solution and water. Alternatively, the liquid LQ may include two or more of ethylene glycol, a dilute hydrofluoric acid solution and water. As the liquid LQ, it may be also possible to use an adhesive. The adhesive has both a function as a liquid for alignment in the method MT and a function of bonding between the substrate and the chip component. As the adhesive, a liquid containing an epoxy resin, an acrylic resin or a polyvinyl alcohol may be used. Metal has a very large surface tension. As such, the liquid LQ may be composed of a nonmetallic material. The liquid LQ may also be composed of a liquid material that provides a small contact angle with respect to a lyophilic region which may be formed of an oxide or the like.

Figure 2:
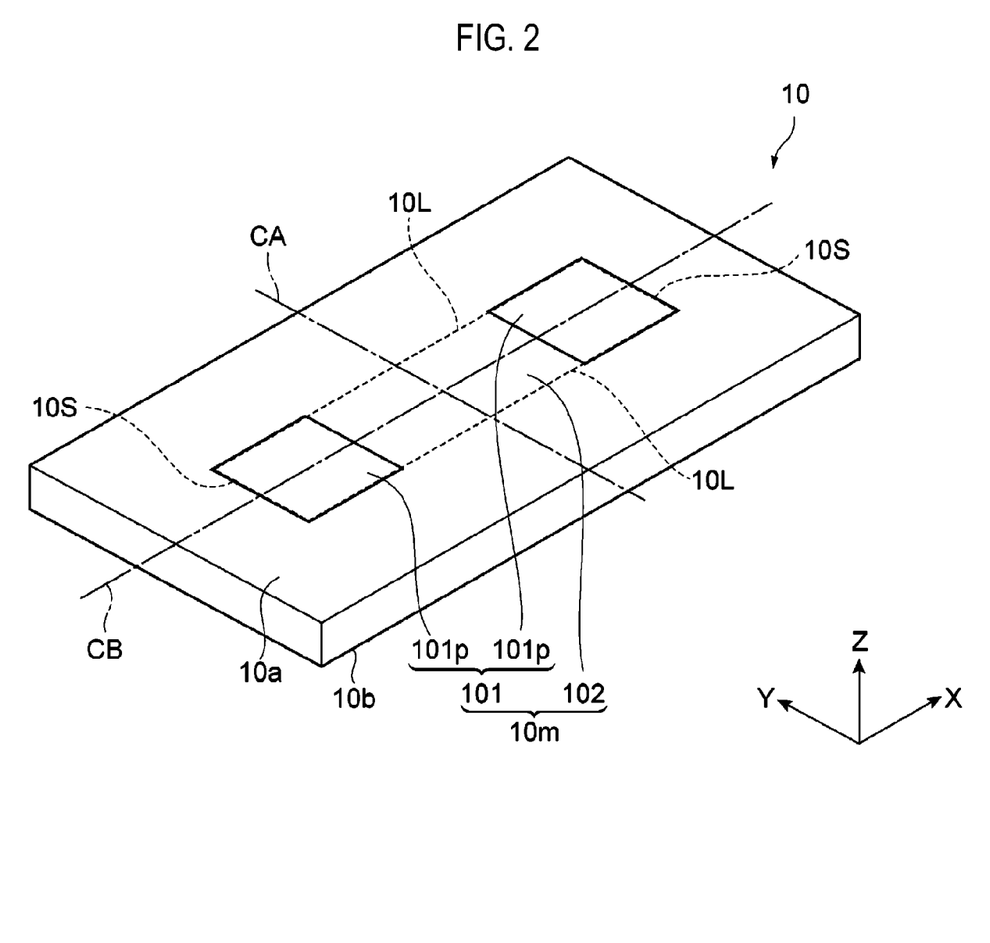
FIG. 2 is a perspective view illustrating a substrate.
Figure 3:
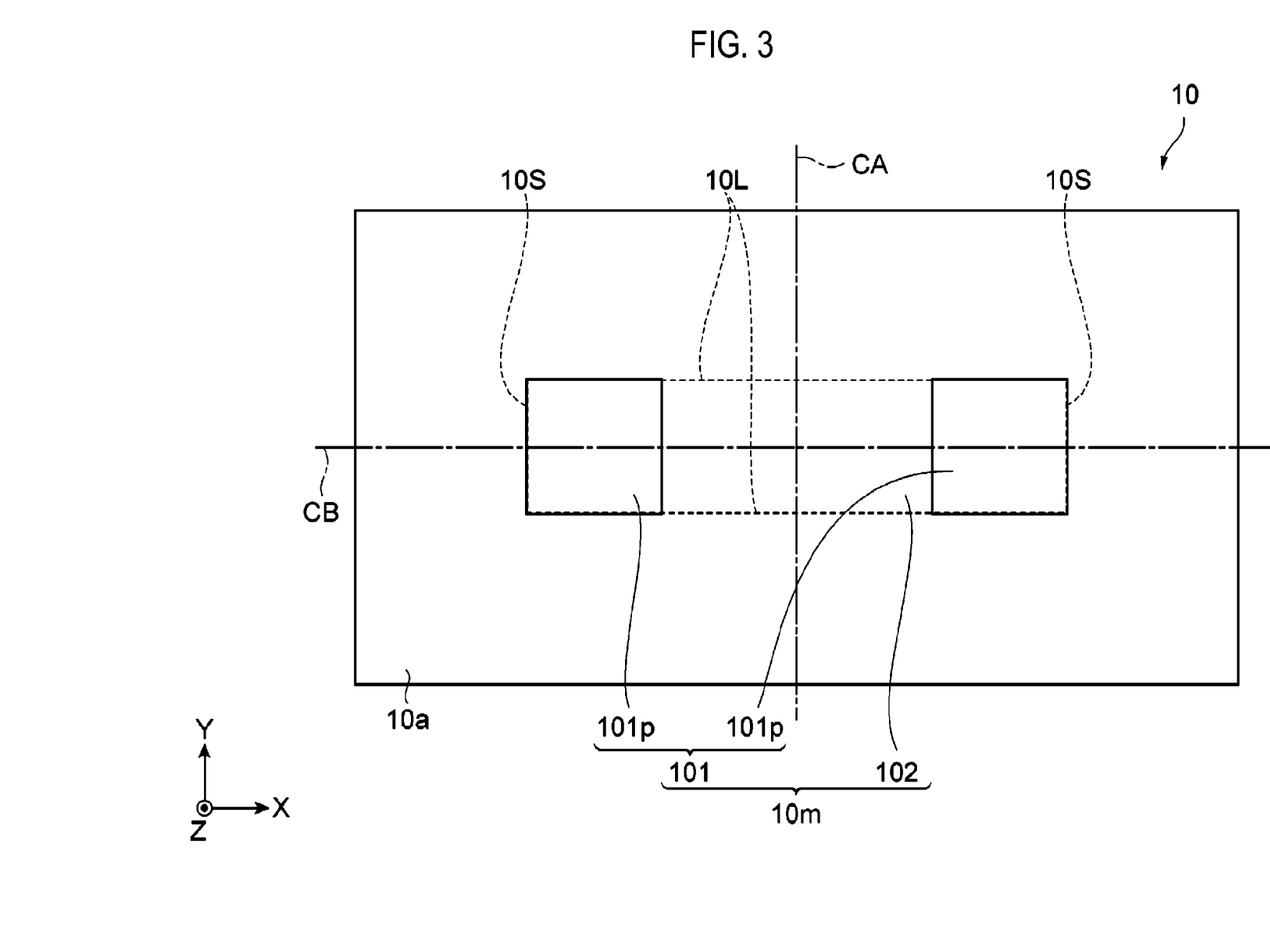
FIG. 3 is a plan view illustrating the substrate.

FIG. 2 is a perspective view illustrating the substrate. FIG. 3 is a plan view illustrating the substrate. As shown in FIGS. 2 and 3, the substrate 10 is a substantially plate-shaped member and has a surface 10a and a surface 10b. The surface 10a (first surface) and the surface 10b are a pair of main surfaces of the substrate 10 and face each other. The surface 10a includes a mounting region 10m. The mounting region 10m is a region on which a chip component 12 is mounted. The mounting region 10m has a rectangular shape extending to have a long length in one direction.

The mounting region 10m includes a first region 101 and a second region 102. The second region 102 is a region other than the first region 101 in the mounting region 10m. The first region 101 has higher wettability than that of the second region 102 with respect to the liquid LQ. That is to say, the first region 101 is a lyophilic region having lyophilicity, and the second region 102 is a lyophobic region having lyophobicity. Furthermore, the surface 10a also provides a lyophobic region having lyophobicity even around the mounting region 10m. In addition, the term "lyophilic" means "hydrophilic" for water, and the term "lyophobic" means "hydrophobic" for water.

The first region 101 is formed of, for example, a silicon oxide. The second region 102 and the region around the first region 101 in the surface 10a are formed of, for example, polytetrafluoroethylene. In producing the substrate 10, for example, a mask covering the first region 101 is formed on a silicon oxide-made surface of a base material, the surface is coated with polytetrafluoroethylene, and then the mask is lifted off. Thus, the substrate 10 is produced. As long as the first region 101 has higher wettability than that of the second region 102 and the wettability of the region around the first region 101, the material of the first region 101, the material of the second region 102, the material of the region around the first region 101, and the method of producing the substrate 10 are not particularly limited.

The first region 101 is provided symmetrically with respect to a first central line CA and symmetrically with respect to a second central line CB. The first central line CA is a central line of the mounting region 10m and is a central line orthogonal to the long side 10L of the mounting region 10m. The second central line CB is a central line of the mounting region 10m and is a central line orthogonal to the short side 10S of the mounting region 10m.

In addition, the first region 101 includes a plurality of partial regions 101p. The plan-view shape of each of the plurality of partial regions 101p is a rectangular shape. A difference between the sum of the lengths of all the sides of the plurality of partial regions 101p in a direction X parallel to the long side 10L of the mounting region 10m and the sum of the lengths of all the sides of the plurality of partial regions 101p in a direction Y parallel to the short side 10S of the mounting region 10m is smaller than a difference between the sum of the lengths of the long sides 10L of the mounting region 10m and the sum of the lengths of the short sides 10S of the mounting region 10m. In the embodiment shown in FIGS. 2 and 3, the plan-view shape of each of the plurality of partial regions 101p is a square shape. In addition, in the embodiments shown in FIGS. 2 and 3, the plurality of partial regions 101p are in contact with the long side 10L and the short side 10S of the mounting region 10m.

Figure 4:
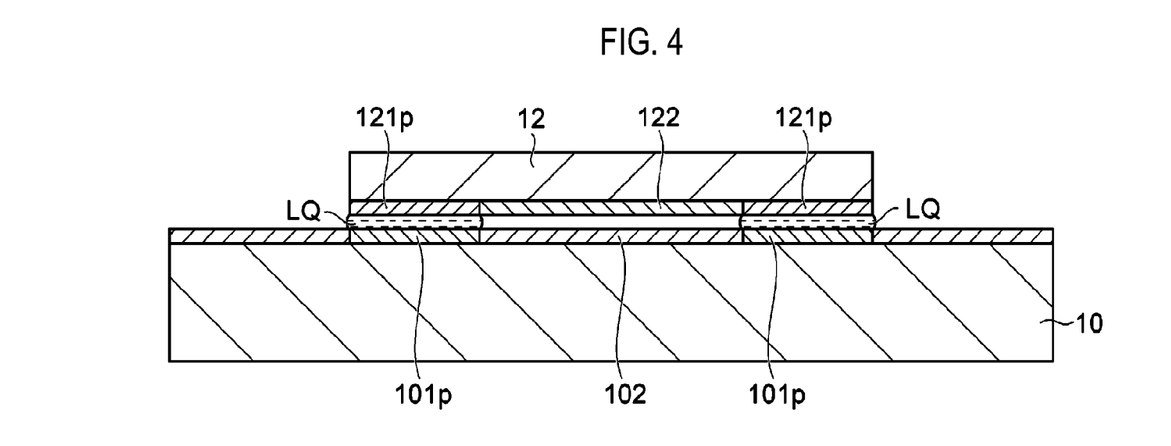
FIG. 4 is a view showing a second step of the method for aligning a chip component relative to a substrate by using a liquid, in accordance with one embodiment.

FIG. 4 is a view illustrating a second step of the method for aligning a chip component relative to a substrate by using a liquid in accordance with one embodiment. In the method according to one embodiment, after the liquid LQ is supplied onto the first region 101, the second step is executed. In the second step, as shown in FIG. 4, the chip component 12 is arranged on the liquid LQ.

Figure 5:
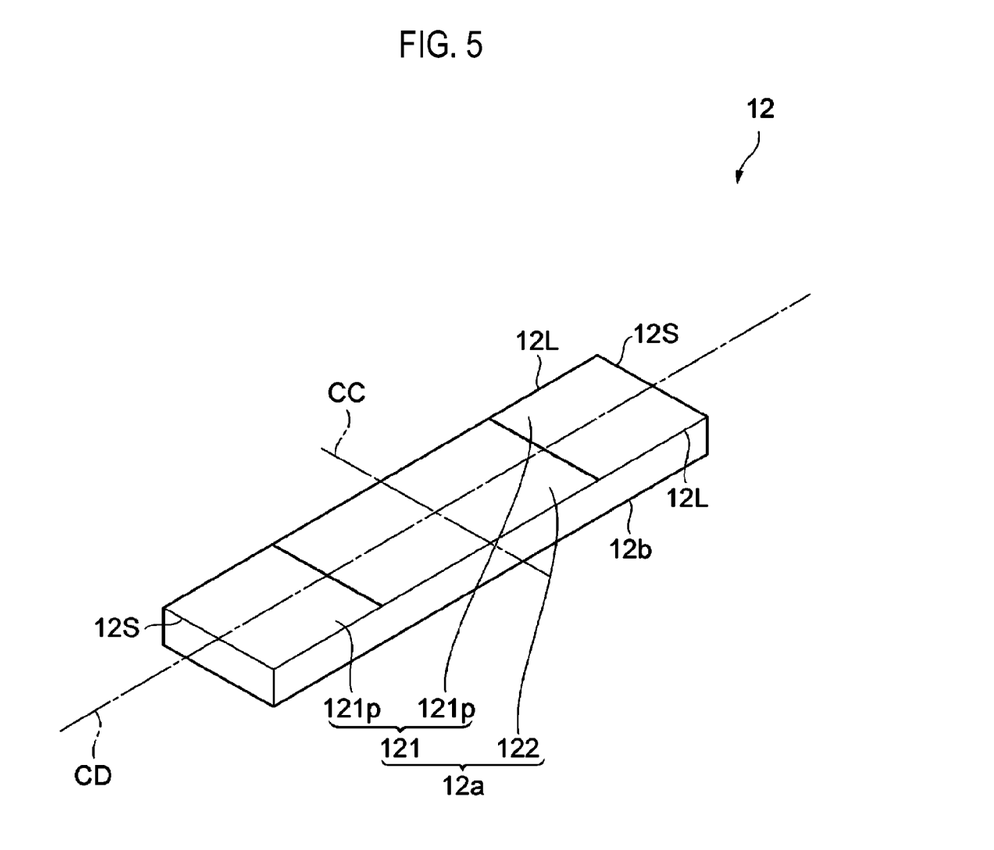
FIG. 5 is a perspective view illustrating a chip component.

The chip component 12 is, for example, a chip-like electronic component such as an LED, a laser or an integrated circuit. FIG. 5 is a perspective view illustrating the chip component. As shown in FIG. 5, the chip component 12 has a surface 12a (second surface) and a surface 12b. The surface 12a and the surface 12b are a pair of main surfaces of the chip component 12 and face each other. The surface 12a is a surface facing the mounting region 10m in the second step. The surface 12a has a rectangular shape extending to have a long length in one direction. The shape of the surface 12a substantially coincides with the shape of the mounting region 10m. In addition, the area of the surface 12a is also substantially equal to the area of the mounting region 10m. The shape of the surface 12a may be slightly different from the shape of the mounting region 10m as long as the effect of the method according to one embodiment is exerted. Further, the area of the surface 12a may be slightly different from the area of the mounting region 10m as long as the effect of the method according to one embodiment is exerted.

In one embodiment, as shown in FIG. 5, the surface 12a includes a first region 121 provided in the same layout as the first region 101 of the mounting region 10m. The first region 121 is a lyophilic region. The first region 121 is provided symmetrically with respect to a first central line CC of the surface 12a and symmetrically with respect to a second central line CD of the surface 12b. The first central line CC is a central line of the surface 12a and is a central line orthogonal to the long side 12L of the surface 12a. The second central line CD is a central line of the surface 12a and is a central line orthogonal to the short side 12S of the surface 12a.

The first region 121 includes a plurality of partial regions 121p provided in the same layout as the plurality of partial regions 101p. The shape of each of the plurality of partial regions 121p substantially coincides with the shape of each of the plurality of partial regions 101p. The area b of each of the plurality of partial regions 121p is also substantially equal to the area of each of the plurality of partial regions 101p. In the embodiment shown in FIG. 5, the plurality of partial regions 121p are in contact with the long side 12L and the short side 12S of the surface 12a and have a square shape. Just like in the first region 101, the first region 121 may be formed from, for example, a silicon oxide.

The surface 12a further includes a second region 122. The second region 122 is a region other than the first region 121 in the surface 12a and is a lyophobic region. Just like the second region 102, the second region 122 may be formed from, for example, polytetrafluoroethylene. In the chip component 12 used in the method of one embodiment, the entire region of the surface 12a may be configured as a hydrophilic region.

As shown in FIG. 4, when the chip component 12 is placed on the liquid LQ, the alignment of the chip component 12 with respect to the mounting region 10m is automatically performed by a capillary force.

Now, it is assumed that both the entire region of the mounting region 10m and the entire region of the surface 12a of the chip component 12 are configured as lyophilic regions. In this case, if the liquid LQ is supplied onto the mounting region 10m and if the chip component 12 is placed on the liquid LQ in a state in which a positional deviation has occurred between the mounting region 10m and the chip component 12, the liquid protrudes from sides of the chip component 12. The seeping liquid generates a resistance force against a driving force (capillary force) that causes the chip component 12 to move above the mounting region 10m. The amount of the liquid seeping from the sides of the chip component 12 in a portion along the long side 10L of the mounting region 10m becomes large. Therefore, a resistance force in the direction orthogonal to the long side 12L of the surface 12a of the chip component 12 may grow large and may be larger than the driving force in the direction orthogonal to the long side 12L of the surface 12a of the chip component 12. Furthermore, the supplied liquid LQ forms a single liquid mass having a surface shape which is convex upward on the mounting region 10m. Therefore, the chip component 12 may be disposed on the liquid LQ in a tilted state. When the chip component 12 is placed on the liquid LQ in such a tilted state, the chip component 12 may slide down from the liquid LQ in the tilted state and may come into contact with the substrate 10. Thus, a sufficient capillary force does not act on the chip component 12. As a result, the positional deviation between the mounting region 10m and the chip component 12 cannot be eliminated.

The substrate 10 used in the method according to one embodiment includes the plurality of partial regions 101p as lyophilic regions in the mounting region 10m. Each of the plurality of partial regions 101p has a rectangular shape. Therefore, the difference between the sum of the lengths of all the sides of the plurality of partial regions 101p extending in the direction X parallel to the long side 10L of the mounting region 10m and the sum of the lengths of all the sides of the plurality of partial regions 101p extending in the direction Y parallel to the short side 10S of the mounting region 10m is smaller than the difference between the sum of the lengths of the long sides 10L and the sum of the lengths of the short sides 10S in the mounting region 10m. As a result, the amount of liquid seeping from the sides of the chip component 12 in a portion along the long side 10L of the mounting region 10m is reduced, so that the resistance force in the direction orthogonal to the long side 12L of the surface 12a of the chip component 12 is reduced. Further, a difference between a driving force in the direction orthogonal to the long side 12L of the surface 12a of the chip component 12 and a driving force in the direction orthogonal to the short side 12S of the surface 12b of the chip component 12 is reduced. Moreover, since the first region 101 is provided symmetrically with respect to both the first central line CA and the second central line CB, the driving force for the chip component 12 is exerted symmetrically with respect to the first central line CA and symmetrically with respect to the second central line CB. In addition, the liquid LQ is divided into a plurality of liquid masses by being supplied to the plurality of partial regions 101p. Since the chip component 12 is held by the plurality of liquid masses, the tilting of the chip component at the time of mounting is reduced. For that reason, according to this method, the accuracy of alignment of the chip component 12 with respect to the mounting region 10m is improved. Inasmuch as the surface shape of the liquid masses formed by the liquid LQ becomes a convex shape by virtue of the surface tension, if the liquid masses are formed on a region having the same area as the area of the surface 12a of the chip component 12, the chip component 12 may be mounted unstably on the liquid masses. However, if the lyophilic region is divided into the plurality of partial regions 101p, the liquid LQ is divided into a plurality of relatively small liquid masses. Therefore, the chip component 12 is stably mounted on the plurality of liquid masses. As a result, the accuracy of alignment of the chip component 12 with respect to the mounting region 10m is improved. In addition, when the same amount of liquid is supplied to the plurality of partial regions 101p, namely when the same amount of liquid LQ is supplied per unit area, the heights of the plurality of liquid masses are equal to each other so that the chip component 12 is stably mounted on the plurality of liquid masses. As a result, the accuracy of alignment of the chip component 12 with respect to the mounting region 10m is further improved.

In the case where each of the plurality of partial regions 101p has a square shape, a difference between the sum of the lengths of a pair of mutually parallel sides in the plurality of partial regions 101p and the sum of the lengths of the other pair of mutually parallel sides in the plurality of partial regions 101p is further reduced. As a result, a difference between the resistance force in the direction orthogonal to the long side 12L of the chip component 12 and the resistance force in the direction orthogonal to the short side 12S of the chip component 12 is reduced. Further, a difference between the driving force in the direction orthogonal to the long side 12L of the chip component 12 and the driving force in the direction orthogonal to the short side 12S of the chip component 12 is reduced. Accordingly, the accuracy of alignment of the chip component 12 with respect to the mounting region 10m is further improved.

Figure 6:
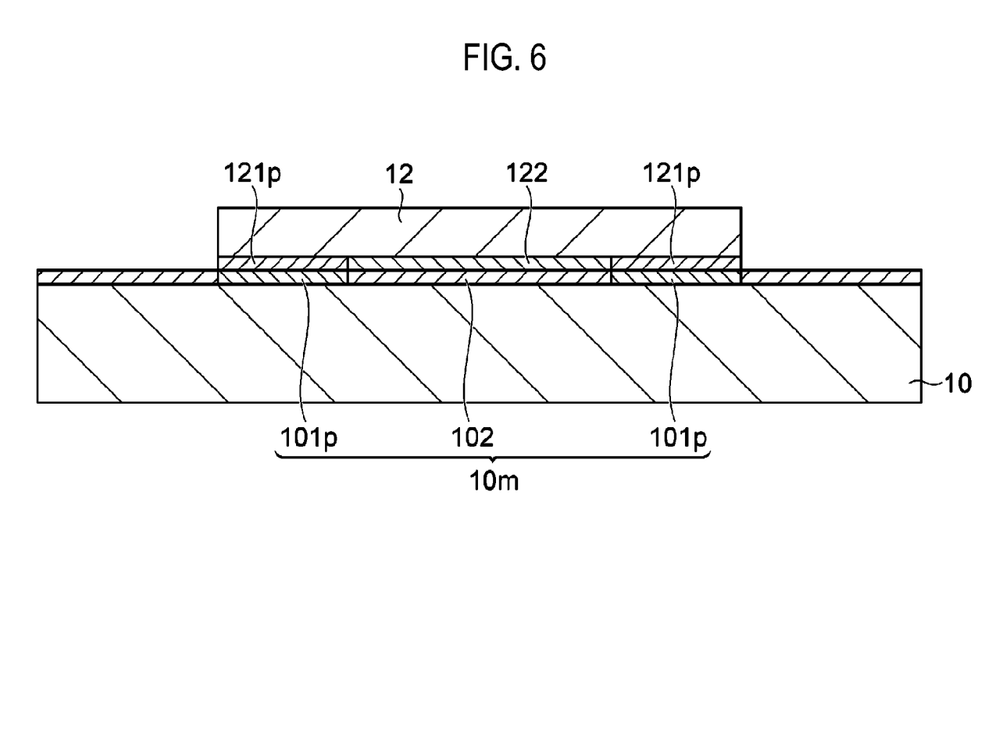
FIG. 6 is a sectional view showing the state of the substrate and the chip component after the liquid is evaporated.

When the liquid LQ evaporates, as shown in FIG. 6, the chip component 12 is disposed directly on the mounting region 10m. Thereafter, the chip component 12 may be fixed to the substrate 10 using an arbitrary bonding material. In the case where the first region 101 is formed of a silicon oxide and the liquid LQ contains a dilute hydrofluoric acid, the chip component 12 and the substrate 10 are bonded to each other by the silicon oxide dissolved by the dilute hydrofluoric acid after the evaporation of the liquid LQ.

Figure 7:
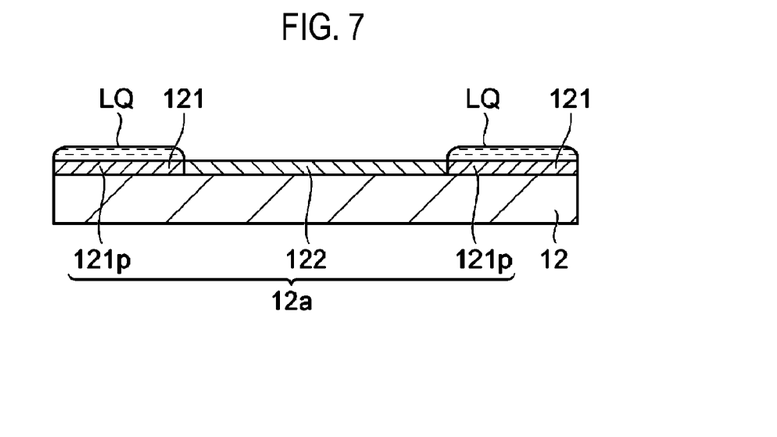
FIG. 7 is a view showing a first step of a method for aligning a chip component relative to a substrate by using a liquid, in accordance with another embodiment.

Hereinafter, another embodiment will be described. FIG. 7 is a view showing a first step of a method for aligning a chip component relative to a substrate by using a liquid in accordance with another embodiment. In the first step of the method according to another embodiment, as shown in FIG. 7, the liquid LQ is supplied onto the first region 121 of the chip component 12.

Figure 8:
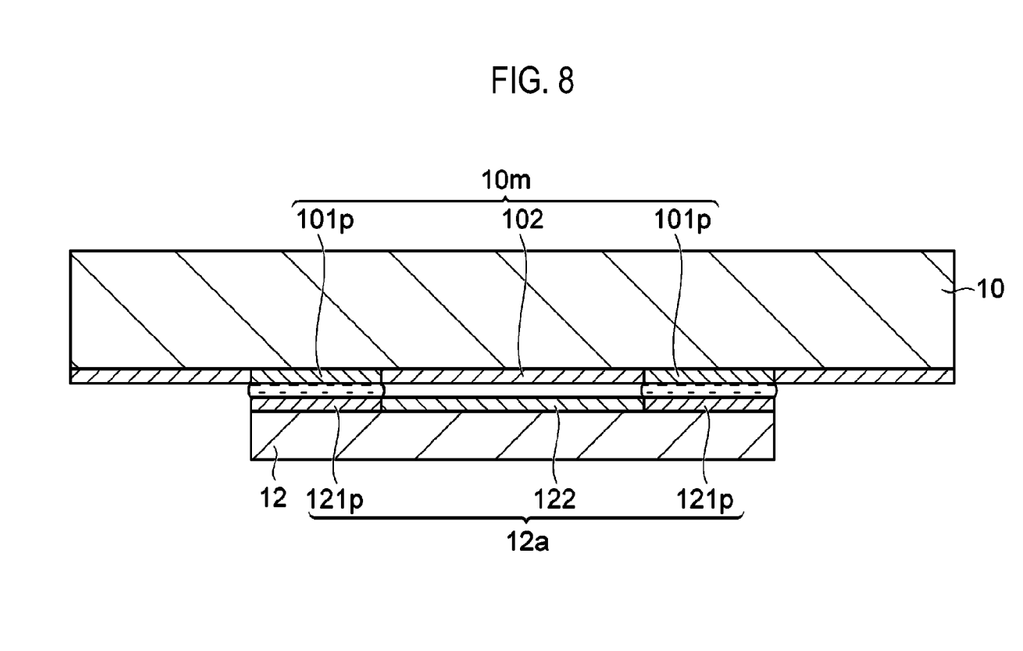
FIG. 8 is a view showing a second step of the method for aligning chip component relative to a substrate by using a liquid, in accordance with another embodiment.

Subsequently, a second step is executed in the method according to another embodiment. In the second step of the method according to another embodiment, as shown in FIG. 8, the mounting region 10m of the substrate 10 is placed on the liquid LQ. In this embodiment, the entire region of the mounting region 10m of the substrate 10 may be configured as a lyophilic region. Alternatively, the mounting region 10m may have the first region 101 provided in the layout shown in FIG. 2. In this case, the mounting region 10m of the substrate 10 is arranged on the liquid LQ so that the first region 101 comes into contact with the liquid LQ.

When the mounting region 10m of the substrate 10 is arranged on the liquid LQ, the alignment of the chip component 12 with respect to the mounting region 10m is automatically performed by virtue of a capillary force. Even in the method according to this alternative embodiment, the accuracy of alignment of the chip component 12 with respect to the mounting region 10m is improved.

In the case where each of the plurality of partial regions 121p has a square shape, a difference between the sum of the lengths of a pair of mutually parallel sides in the plurality of partial regions 121p and the sum of the lengths of the other pair of mutually parallel sides in the plurality of partial regions 121p is further reduced. As a result, a difference between a resistance force in the direction orthogonal to the long side 12L of the chip component 12 and a resistance force in the direction orthogonal to the short side 12S of the chip component 12 is reduced. Further, a difference between a driving force in the direction orthogonal to the long side 12L of the chip component 12 and a driving force in the direction orthogonal to the short side 12S of the chip component 12 is reduced. Accordingly, the accuracy of alignment of the chip component 12 with respect to the mounting region 10m is further improved.

Figure 9:
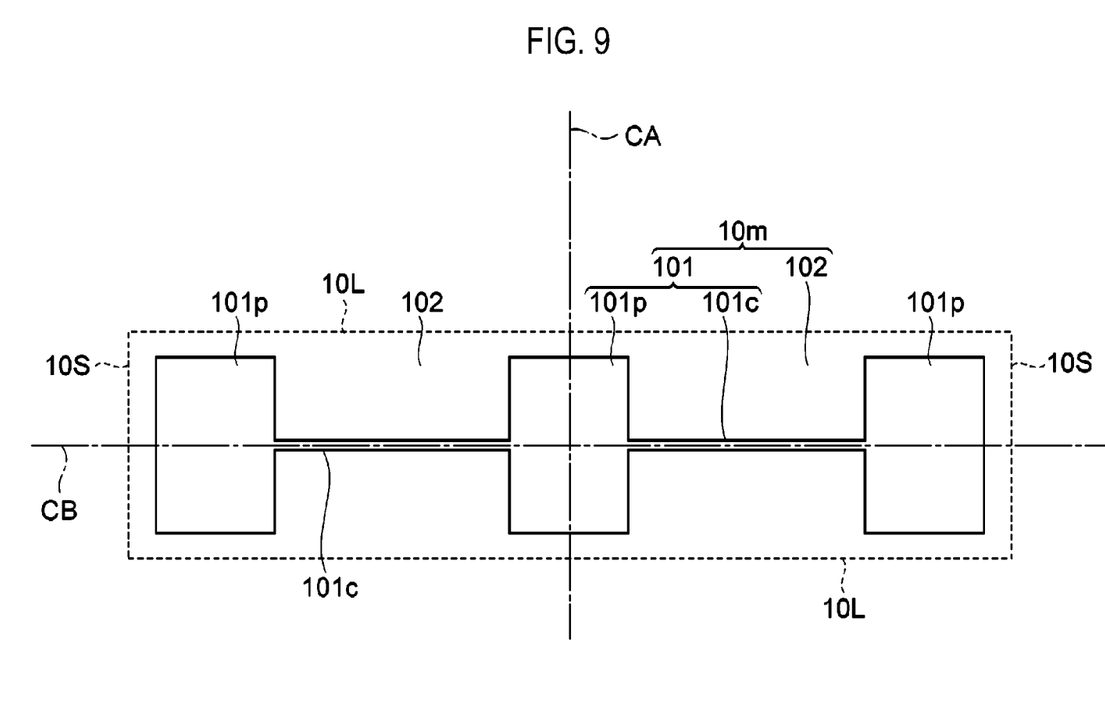
FIG. 9 is a plan view showing another example of a pattern in a mounting region.
Figure 10:
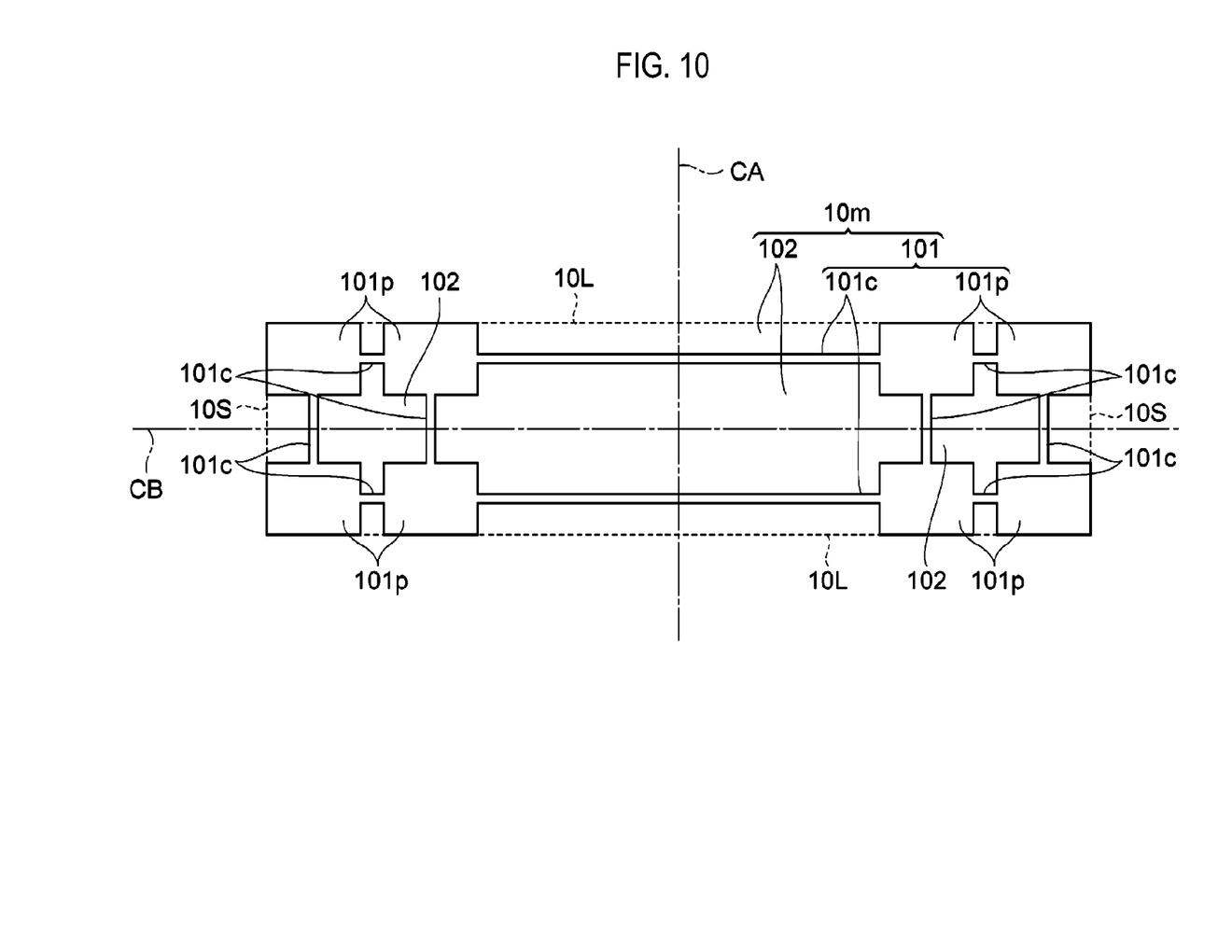
FIG. 10 is a plan view showing further another example of the pattern in the mounting region.

While various embodiments have been described above, the present disclosure is not limited to the above-described embodiments. Various modifications may be made. For example, the pattern of the lyophilic region and the lyophobic region in the mounting region 10m may be a pattern shown in FIG. 9 or FIG. 10. That is to say, as shown in FIG. 9, the plurality of partial regions 101p may not be in contact with the long side 10L of the mounting region 10m. In addition, the plurality of partial regions 101p may not be in contact with the short side 10S of the mounting region 10m. Further, the partial region 101p may be provided in a portion including a position where the first central line CA and the second central line CB are orthogonal to each other. In addition, the first region 101 may include a connection region 101c through which the plurality of partial regions 101p is connected to each other. The connection region 101c is a lyophilic region and may be formed of the same material as the partial region 101p. Further, the connection region 101c has a width narrower than the length of the shortest side of each of the plurality of partial regions 101p. According to the connection region 101c, even if the liquid LQ is insufficient on some of the plurality of partial regions 101p, the liquid LQ is supplemented from other partial regions 101p to some of the plurality of partial regions 101p via the respective connection region 101c. The connection region 101c may be formed so that an isolated partial region 101p, i.e., a partial region 101p not connected to other partial regions 101p, is not present, or may be formed so that all the partial regions 101p are connected to each other. In some embodiments, as shown in FIG. 10, two or more partial regions 101p may be provided on each side with respect to the first central line CA. Furthermore, two or more partial regions 101p may be provided on each side with respect to the second central line CB.

Figure 11:
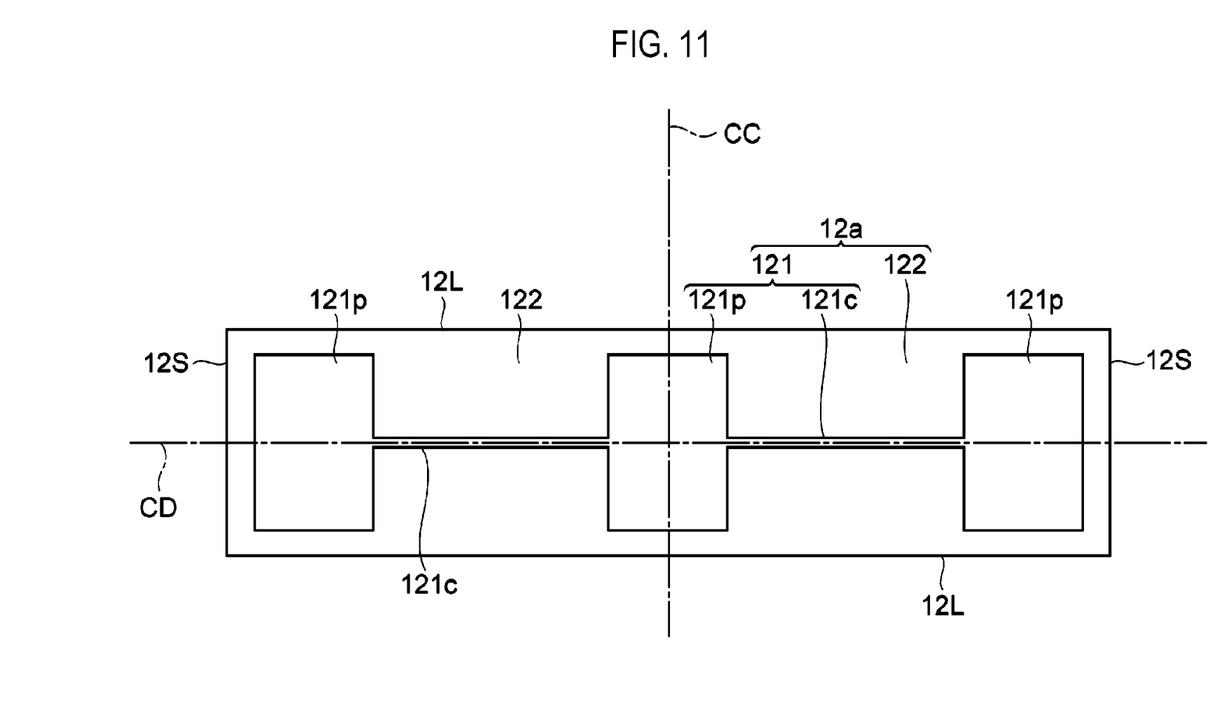
FIG. 11 is a plan view showing another example of a pattern of one main surface of a chip component.
Figure 12:
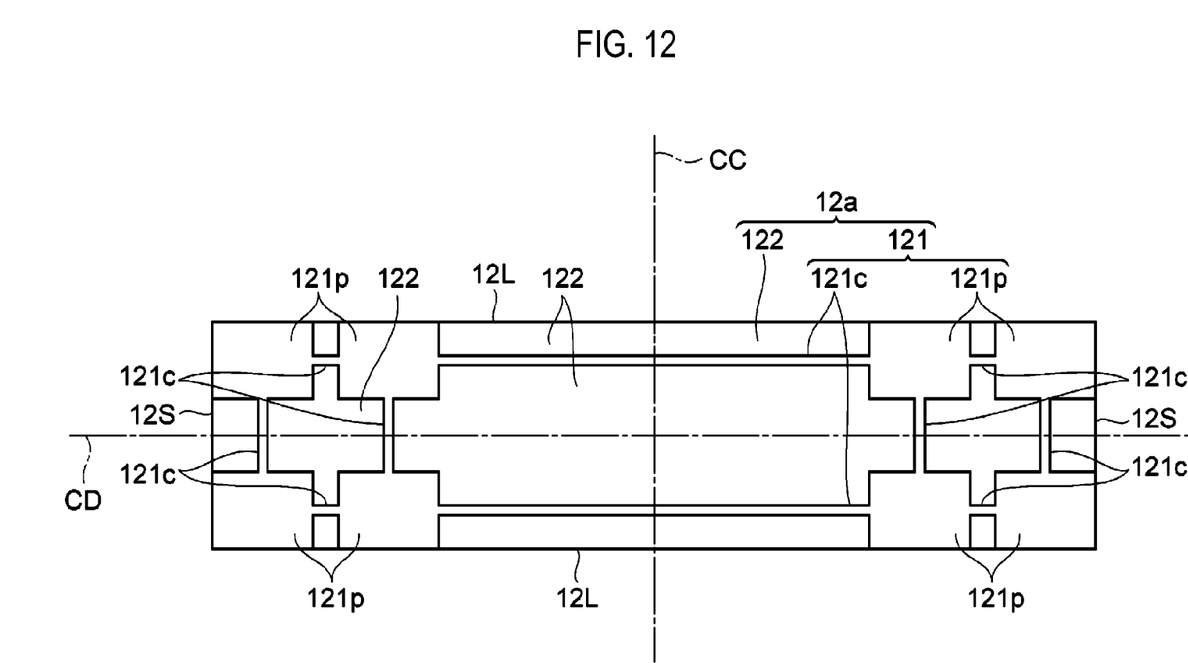
FIG. 12 is a plan view showing further another example of the pattern of one main surface of the chip component.

The pattern of the lyophilic region and the lyophobic region in the surface 12a of the chip component 12 may be a pattern shown in FIG. 11 or FIG. 12. That is to say, as shown in FIG. 11, the plurality of partial regions 121p may not be in contact with the long side 12L of the surface 12a. In addition, the plurality of partial regions 121p may not be in contact with the short side 12S of the surface 12a. Further, the partial region 121p may be provided in a portion including a position where the first central line CC and the second central line CD are orthogonal to each other. Moreover, the first region 121 may include a connection region 121c through which the plurality of partial regions 121p is connected to each other. The connection region 121c is a lyophilic region and may be formed of the same material as the partial region 121p. In addition, the connection region 121c has a width narrower than the length of the shortest side of each of the plurality of partial regions 121p. According to the connection region 121c, even if the liquid LQ is insufficient on some of the plurality of partial regions 121p, the liquid LQ is supplemented to some of the plurality of partial regions 121p from other partial regions 121p via the respective connection region 121c. Furthermore, as shown in FIG. 12, two or more partial regions 121p may be provided on each side with respect to the first central line CC. In addition, two or more partial regions 121p may be provided on each side with respect to the second central line CD.

EXPLANATION OF REFERENCE NUMERALS

10: substrate, 10a: surface, 10m: mounting region, 101: first region, 101p: partial region, 101c: connection region, 102: second region, CA: first central line, CB: second central line, 12: chip component, 12a: surface, 121: first region, 121p: partial region, 121c: connection region, 122: second region, CC: first central line, CD: second central line, LQ: liquid

What is claimed is:

1. A method for aligning a chip component relative to a substrate by using a liquid, comprising:
   supplying a liquid remaining in a liquid state under a temperature environment lower than 100 degrees C. to the substrate; and
   arranging the chip component on the liquid,
   wherein the substrate includes a first surface in which a mounting region having a rectangular shape extending to have a long length in one direction is formed,
   the chip component includes a second surface facing the mounting region in the arranging the chip component,
   wherein the second surface has a rectangular shape which substantially coincides with the shape of the mounting region and has an area substantially equal to an area of the mounting region,
   the mounting region includes a first region and a second region other than the first region in the mounting region,
   a wettability of the first region with respect to the liquid is higher than a wettability of the second region with respect to the liquid,
   the first region is provided symmetrically with respect to a first central line orthogonal to a long side of the mounting region and provided symmetrically with respect to a second central line orthogonal to a short side of the mounting region, the first region including a plurality of partial regions each having a rectangular shape, and
   wherein the supplying a liquid includes supplying the liquid to the first region.

2. A method for aligning a chip component relative to a substrate by using a liquid, comprising:
   supplying a liquid remaining in a liquid state under a temperature environment lower than 100 degrees C. to the chip component; and
   arranging the substrate on the liquid,
   wherein the substrate includes a first surface in which a mounting region having a rectangular shape extending to have a long length in one direction is formed,
   the chip component includes a second surface facing the mounting region in the arranging the substrate,
   wherein the second surface includes a rectangular shape which substantially coincides with the shape of the mounting region and has an area substantially equal to an area of the mounting region,
   the second surface includes a first region and a second region other than the first region in the mounting region,
   a wettability of the first region with respect to the liquid is higher than a wettability of the second region with respect to the liquid,
   the first region is provided symmetrically with respect to a first central line orthogonal to a long side of the second surface and provided symmetrically with respect to a second central line orthogonal to a short side of the second surface, the first region including a plurality of partial regions each having a rectangular shape, and
   wherein the supplying a liquid includes supplying the liquid to the first region.

3. The method of claim 1, wherein the shape of each of the plurality of partial regions is a square shape.

4. The method of claim 1, wherein the first region further includes a connection region through which the plurality of partial regions is connected to each other.

5. The method of claim 1, wherein the first region is formed of a silicon oxide, and the liquid contains a dilute hydrofluoric acid.

6. The method of claim 1, wherein the liquid includes at least one of water and ethylene glycol.

7. The method of claim 1, wherein the liquid includes an epoxy resin, an acrylic resin or a polyvinyl alcohol.

8. The method of claim 2, wherein the shape of each of the plurality of partial regions is a square shape.

9. The method of claim 2, wherein the first region further includes a connection region through which the plurality of partial regions is connected to each other.

10. The method of claim 2, wherein the first region is formed of a silicon oxide, and the liquid contains a dilute hydrofluoric acid.

11. The method of claim 2, wherein the liquid includes at least one of water and ethylene glycol.

12. The method of claim 2, wherein the liquid includes an epoxy resin, an acrylic resin or a polyvinyl alcohol.

* * * * *